(12) United States Patent
Kwak et al.

(10) Patent No.: US 11,226,510 B2
(45) Date of Patent: Jan. 18, 2022

(54) DISPLAY ASSEMBLY

(71) Applicant: LG Electronics Inc., Seoul (KR)

(72) Inventors: Younghun Kwak, Seoul (KR); Daehong Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/620,449

(22) PCT Filed: Aug. 31, 2017

(86) PCT No.: PCT/KR2017/009533
§ 371 (c)(1),
(2) Date: Dec. 6, 2019

(87) PCT Pub. No.: WO2018/225895
PCT Pub. Date: Dec. 13, 2018

(65) Prior Publication Data
US 2020/0096811 A1    Mar. 26, 2020

(30) Foreign Application Priority Data

Jun. 7, 2017 (KR) .......................... 10-2017-0070858

(51) Int. Cl.
*G02F 1/1333* (2006.01)
*H05K 5/00* (2006.01)
*H05K 5/02* (2006.01)

(52) U.S. Cl.
CPC ..... *G02F 1/133308* (2013.01); *H05K 5/0017* (2013.01); *H05K 5/0217* (2013.01); *G02F 2202/28* (2013.01)

(58) Field of Classification Search
CPC ................ H05K 5/0217; H05K 5/0017; G02F 1/133308; G02F 2202/28; G09F 9/30; G06F 1/16
See application file for complete search history.

(56) References Cited

U.S. PATENT DOCUMENTS

| 9,568,800 B1 * | 2/2017 | Sprague ............ G02F 1/133308 |
| 10,670,894 B2 * | 6/2020 | Lee .................... G02F 1/136204 |
| 2009/0183819 A1 * | 7/2009 | Matsuhira .......... G02F 1/133308 156/99 |

(Continued)

FOREIGN PATENT DOCUMENTS

| JP | 5816388 | 11/2015 |
| KR | 1020100046478 | 5/2010 |

(Continued)

OTHER PUBLICATIONS

EP Extended European Search Report in European Appln. No. 17912493.8, dated Feb. 11, 2021, 9 pages.

*Primary Examiner* — Hoan C Nguyen
(74) *Attorney, Agent, or Firm* — Fish & Richardson P.C.

(57) ABSTRACT

The present invention relates to a display assembly comprising: a cover provided with a curved surface formed so as to be bent; a display arranged on the curved surface; an adhesive layer arranged between the cover and the display; and a wall structure which is arranged on the cover and of which one surface is brought into contact with the curved surface and the other surface is brought into contact with a side surface of the adhesive layer, so as to be extendedly formed along the side surface of the adhesive layer.

17 Claims, 9 Drawing Sheets

(56) References Cited

U.S. PATENT DOCUMENTS

| | | | | |
|---|---|---|---|---|
| 2012/0299809 | A1* | 11/2012 | Fujii | G02F 1/133308 |
| | | | | 345/102 |
| 2013/0094160 | A1* | 4/2013 | Narumi | G02F 1/133308 |
| | | | | 361/752 |
| 2015/0092122 | A1 | 4/2015 | Youn | |
| 2015/0092362 | A1* | 4/2015 | Ahn | G02F 1/133305 |
| | | | | 361/749 |
| 2015/0351272 | A1* | 12/2015 | Wildner | G02F 1/133308 |
| | | | | 361/679.21 |
| 2017/0101340 | A1* | 4/2017 | Inoue | C03C 17/32 |
| 2018/0065881 | A1* | 3/2018 | Hashimoto | C03C 3/087 |
| 2019/0033651 | A1* | 1/2019 | Lee | G02F 1/136204 |

FOREIGN PATENT DOCUMENTS

| | | |
|---|---|---|
| KR | 1020130048681 | 5/2013 |
| KR | 101446414 | 10/2014 |
| KR | 1020140142904 | 12/2014 |
| KR | 1020150035241 | 4/2015 |

* cited by examiner

DISPLAY ASSEMBLY

CROSS-REFERENCE TO RELATED APPLICATIONS

This application is a National Stage application under 35 U.S.C. § 371 of International Application No. PCT/KR2017/009533, filed on Aug. 31, 2017, which claims the benefit of Korean Application No. 10-2017-0070858, filed on Jun. 7, 2017. The disclosures of the prior applications are incorporated by reference in their entirety.

FIELD

This disclosure generally relates to a display assembly.

BACKGROUND

Displays often use covers for protection. Existing techniques for attaching covers to displays have several shortcomings such as lowering the light reflectance of a display assembly or problems with deploying a controlled amount of adhesive to ensure that a high quality adhesion is implemented between the cover and the display,

SUMMARY

This disclosure generally describes a display assembly having a wall structure capable of effectively bonding a display on a curved cover. According to some implementations, a display assembly may include a cover having a curved surface formed to be bent, a display disposed on the curved surface, an adhesive layer disposed between the cover and the display, and a wall structure disposed on the cover, and extending along a side surface of the adhesive layer while one surface thereof is in contact with the curved surface and another surface is in contact with the side surface of the adhesive layer.

In some implementations, the wall structure in the display assembly may be provided with an inner wall having one surface in contact with the side surface of the adhesive layer, and an outer wall disposed between the inner wall and an edge of the cover.

In some implementations, the wall structure in the display assembly may be provided with a protrusion protruding from a surface thereof in contact with the adhesive layer toward a center of the adhesive layer, and extending in a direction in which the wall structure extends.

In some implementations, the wall structure in the display assembly may include a defoaming passage. The defoaming passage may penetrate through a surface of the wall structure, which is in contact with the adhesive layer, and an opposite surface of the surface, and have a shape bent at least once.

According to aspects of the present disclosure, one or more of the following effects can be provided.

First, by including a wall structure disposed on a cover and extending long along a side surface of an adhesive layer with one surface in contact with a curved region and another surface in contact with the side surface of the adhesive layer, an optical adhesive material coated to attach a display can be evenly applied onto the curved cover.

Second, by including a wall structure, which is provided with an inner wall having one surface in contact with the side surface of the adhesive layer, and an outer wall disposed between the inner wall and an edge of the cover, an overflow of the liquid optical adhesive material due to a manufacturing tolerance can be prevented.

Third, by including a wall structure, which is provided with a protrusion protruding from a surface thereof in contact with the adhesive layer toward a center of the adhesive layer and extending in a direction in which the wall structure extends, a display and a cover can be effectively attached to each other while reducing an amount of an optical adhesive material used during an optical bonding process.

Fourth, by including a wall structure, which is provided with a defoaming passage penetrating through a surface of the wall structure in contact with the adhesive layer and an opposite surface to the surface, and having a shape bent at least once, foams in an adhered portion of a display can be effectively discharged to outside of the adhered portion during a display attaching process.

Other implementations of these aspects include corresponding systems, apparatus, computer-readable storage mediums, and computer programs configured to implement the features and effects noted above.

The effects of the present disclosure are not limited to those effects mentioned above, and other effects not mentioned may be clearly understood by those skilled in the art from the description of the claims.

DETAILED DESCRIPTION OF THE DISCLOSURE

Figure 1:
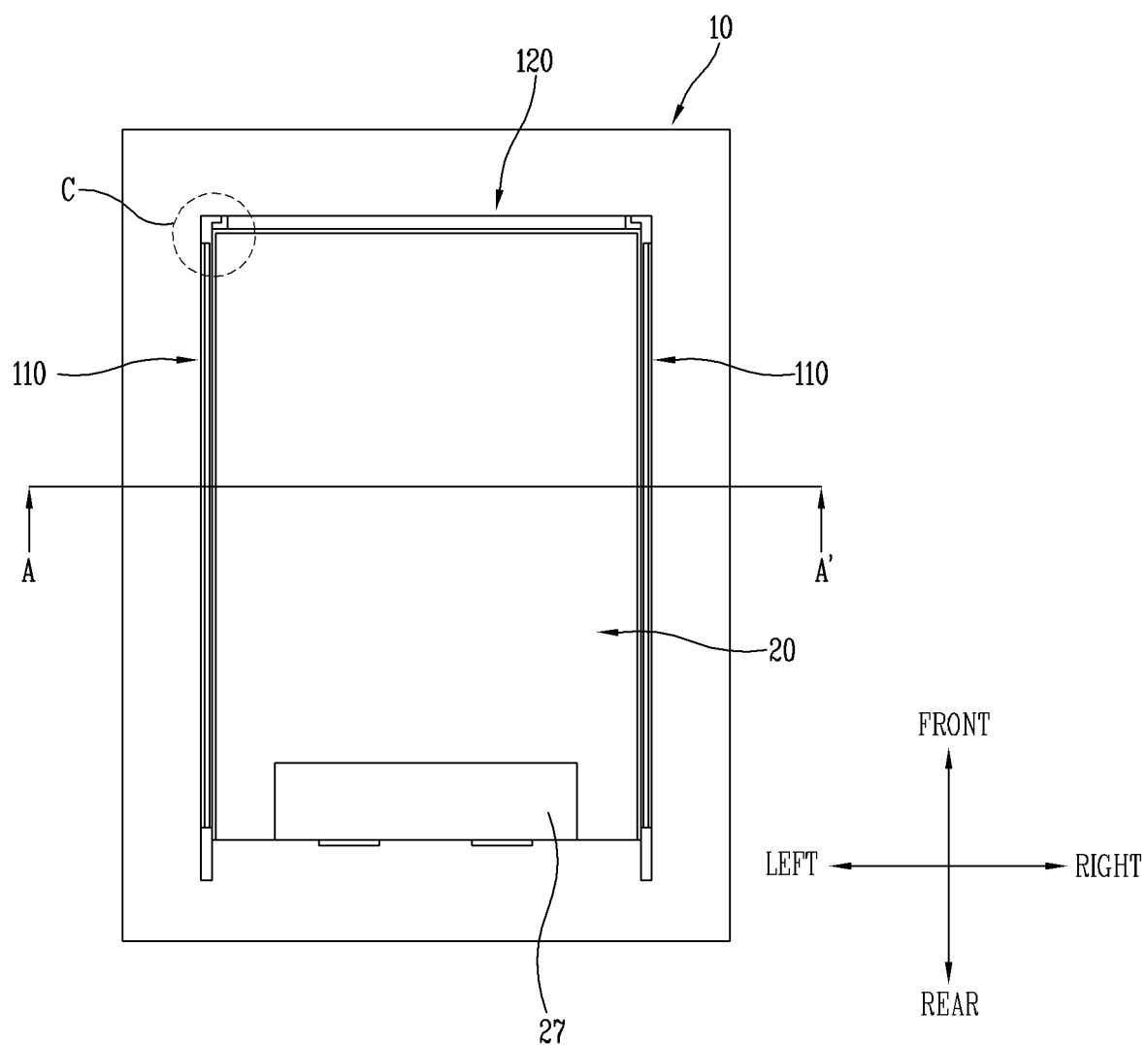
FIG. 1 is a planar view of a display assembly, viewed from a top side of the display assembly.
Figure 2:
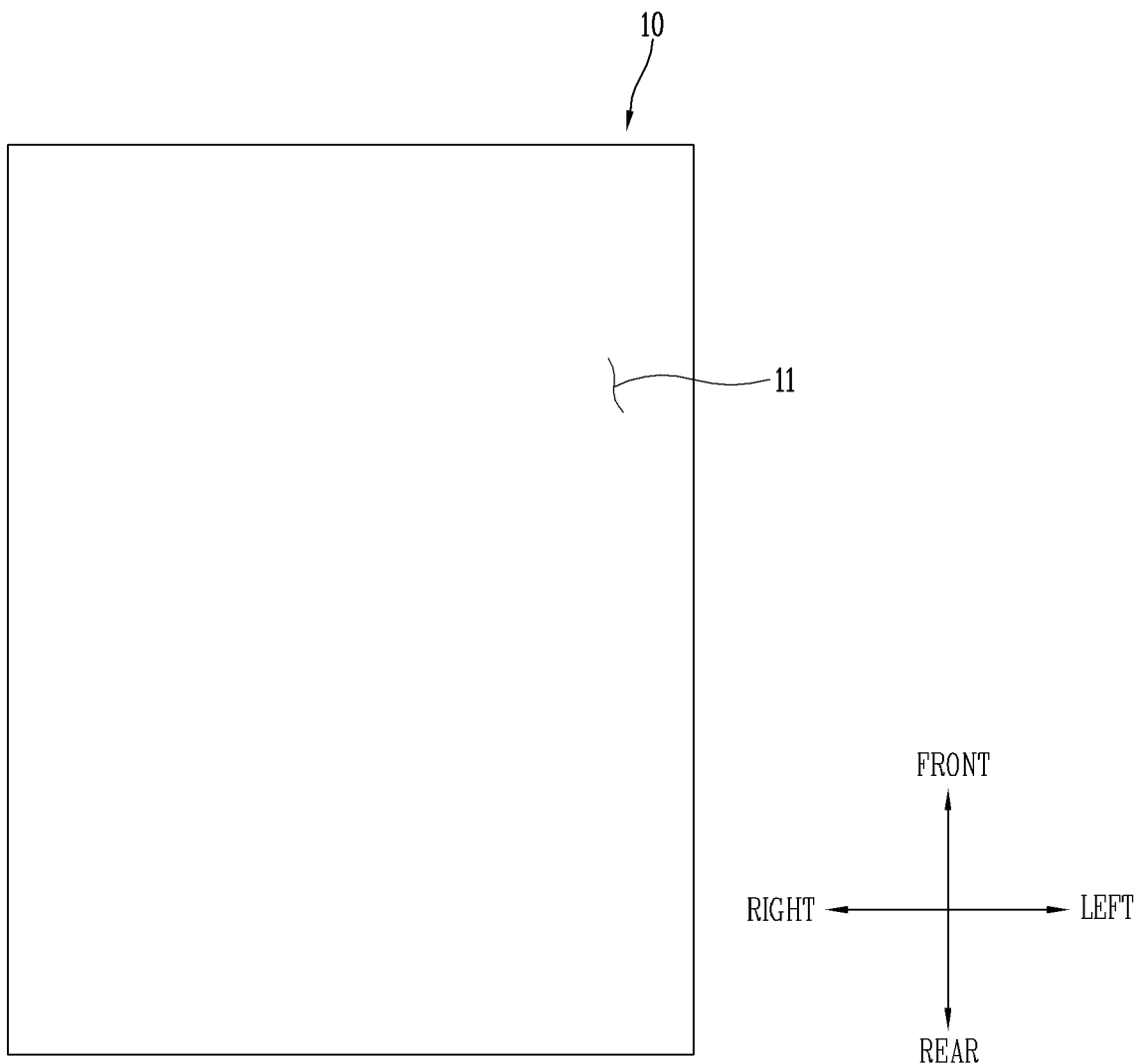
FIG. 2 is a rear view of the display assembly of FIG. 1, viewed from a bottom side of the display assembly.

Hereinafter, a display assembly according to implementations of the present disclosure will be described with reference to the drawings.

Referring to FIGS. 1-5, a display assembly includes a cover 10 having a curved surface capable of being bent. The display assembly includes a display 20 disposed on the curved surface. The display assembly includes an adhesive layer 30 disposed between the cover 10 and the display 20. The display assembly includes a wall structure 100. The wall structure 100 is disposed on the cover 10. The wall structure 100 has one surface brought into contact with the curved surface and another surface brought into contact with a side surface of the adhesive layer 30. The wall structure 100 extends along the side surface of the adhesive layer 30.

The cover 10 may be formed into a substantially rectangular plate shape. The cover 10 may be partially or wholly formed to be transparent, semitransparent or opaque. The semitransparent or transparent portion of the cover 10 may be provided with an opaque sheet on its upper surface to protect internal members from external light.

The cover 10 may be wholly or partially formed of a light-transmitting material. At least part of the cover 10 may be formed as a light-transmissive portion so that external light can be transmitted to the inside of the cover 10. In some cases, at least part of the cover 10 may be formed as a light-transmissive portion so that light emitted from the display 20 can be discharged to the outside through the cover 10. When viewed from a bottom of the cover 10, an active area which is a light-emitted portion of the display 20 may be wider than the light-transmissive portion of the cover 10, so that light emitted from the display 20 can be discharged to outside through the cover 10.

The cover 10 may be formed to be concave, convex or bent into different shapes. The cover 10 may be integrally formed so that a bent or curved portion and a flat portion are continuously connected to each other, which may result in obtaining structural rigidity and improving the appearance of the cover 10.

The cover 10 may be provided with at least one surface formed to be curved or flat. The display assembly may be provided with a plurality of displays 20 arranged on the at least one surface.

Figure 3:
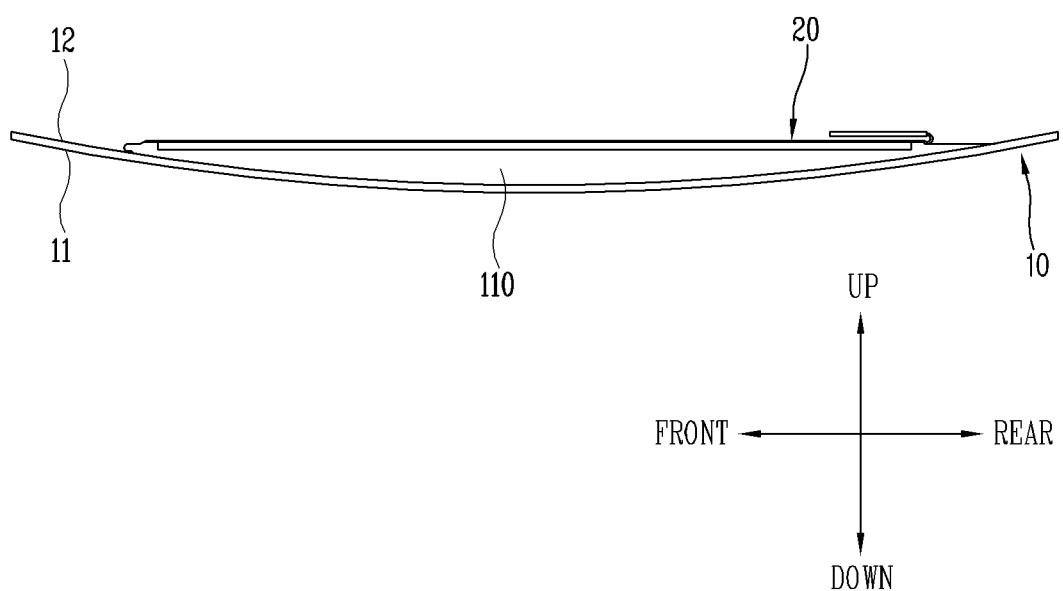
FIG. 3 is a lateral view of the display assembly of FIG. 1.

In some implementations, as shown in FIG. 3, the cover 10 may be formed in a curved shape which is downwardly convex as a whole. The cover 10 may be provided with a lower surface 11, which is curved in a downwardly convex manner, and an upper surface 12, which is curved in a downwardly convex manner. The upper surface 12 of the cover 10 is curved in a downwardly concave manner when viewed from above.

In some implementations, the upper surface 12 of the cover 10 includes an adhesion surface which is not curved or bent in a left-right direction and is curved in a front-rear direction. The display 20 is attached to the adhesion surface. The cover 10 may be formed such that a surface extending from the edge of the attachment surface of the display 20 to the edge of the cover 10 is inclined downward toward the center of the cover 10.

The cover 10 may be provided with a coupling member for coupling the cover 10 to a main body to which the cover 10 is attached. The coupling member includes at least one of a protrusion, a ring, and a bolt coupling portion. The coupling member may include a coupling ring which is hooked to the main body. The coupling member may include a cover coupling portion that is coupled to the main body in a bolt-nut coupling manner.

The cover 10 may be provided with a guide member for guiding a coupling position with the main body to which the cover 10 is coupled.

The cover 10 may be provided with a cover wall structure on a rear side. The cover wall structure may be connected to side wall structures 110 to form a space in which the adhesive layer 30 is received. The cover wall structure can prevent a liquid adhesive material from flowing to the rear when adhering the display 20.

The display 20 may be a flat or curved display. The display 20 may be formed in a shape having a constant thickness or having one or more portions with different thicknesses. The display 20 may be formed in a circular or polygonal shape. In the implementation depicted in FIG. 4, the display 20 is formed in a rectangular plate shape. In some cases, the display 20 may be formed as a plane having a constant thickness. The display 20 may be provided, at an edge thereof, a portion whose thickness is made thinner than a central portion by a predetermined length.

The display 20 may be implemented in various suitable ways. For example, the display may be implemented as a liquid crystal display (LCD), a Light Emitting Diode (LED), or an Organic Light Emitting Diode (OLED) display.

The display 20 may be configured to emit light or include a backlight (not shown) configured to emit light. The backlight may be disposed on an upper side of the display 20.

The display 20 may be disposed on an upper side (e.g., the upper surface 12) of the cover 10. The display 20 may be attached on the upper surface 12 of the cover 10 by an adhesive layer 30. The adhesive layer 30 may be formed using various suitable methods, including but not limited to, by curing a liquid adhesive material.

The display 20 may be spaced apart from the upper surface 12 of the cover 10 by a predetermined distance. The distance between the display 20 and the lowest point of the upper surface 12 of the cover 10 may vary depending on a curvature of the upper surface 12 of the cover 10.

The display 20 may be attached in a tilted manner to an upper surface 12 of the cover 10. In some cases, the display 20 may be attached from the front side in a state of being tilted to the front when it is attached to the upper surface 12. This implementation is effective when the display 20 is attached from the left side in a state of being tilted to the front.

A wall structure 100 is disposed in order to prevent the liquid adhesive material from flowing toward edges of the cover 10 from a portion, at which the display 20 is attached on the upper surface 12 of the cover 10, to other members during attachment of the display 20. The wall structure 100 will be described later.

In some cases, the display 20 may be disposed so as not to be in contact with other members of the display assembly, such as the cover 10 or the wall structure 100, in addition to the adhesive layer 30. In the case where the display 20 is in contact with other members of the display assembly having a fixed shape and a contact surface between the display 20 and the other members is not constant, stress or deformation may occur. By disposing the display 20 on the adhesive layer 30, stress or deformation caused due to a contact with other members may be prevented. When a distance between the display 20 and another member such as the cover 10 or the wall structure 100 is not constant due to manufacturing tolerances, the adhesive layer 30 may act as a buffer.

In some implementations, the display 20 may be disposed in contact with an upper end of the wall structure 100. The display 20 may be bonded or attached to the upper end of the wall structure 100. In implementations in which a backlight is also part of the display assembly, the display 20 may be bonded to the cover 10 in a state where the display 20 is first coupled with a backlight.

A backlight may be disposed on an upper side of the display 20. The backlight is attached on a display upper surface 21 shown in FIG. 6. The backlight may be an LED backlight or other light source.

A display bottom surface 22 may be formed to be flat or curved depending on the type of the display 20. In such implementations, the display 20 is a flat display and the display bottom surface 22 is also formed flat. The display bottom surface 22 is disposed to be spaced apart from a wall structure protrusion 130 by a predetermined distance in a perpendicular direction.

The display bottom surface 22 may include an active region and an inactive region. The active region may emit light by itself or by a backlight disposed on the display top surface 21.

The display bottom surface 22 may be spaced apart from the upper surface 12 of the cover 10 by a predetermined distance. The distance between the display bottom surface 22 and the upper surface 12 of the cover 10 may vary depending on a curvature of the upper surface 12 of the cover 10.

The active region may be formed in a flat or curved shape depending on the type of the display 20. For example, when the display 20 is a flat display, the active region is also formed flat. The active region may perform one or more functions of the display 20. The light emitted from the active region passes through the light-transmissive portion of the cover 10 and is discharged outside the cover 10.

The inactive region may be disposed around the active region. The inactive region does not emit light. A portion of the cover 10 where the inactive region is disposed may be formed opaque so that the inactive region is not visible to the user. The cover 10 may be provided with an opaque sheet or the like attached on a portion of the upper surface 12 of the cover 10 so that the inactive region is not visible to the user.

A display front surface 23 may be disposed adjacent to a front wall structure 120. The display front surface 23 is disposed to be spaced apart from the front wall structure 120 by a predetermined distance in a perpendicular direction.

A display rear surface 24 may be disposed adjacent to a cover rear wall. The display rear surface 24 is disposed to be spaced apart from the cover rear wall 18 by a predetermined distance.

Both side surfaces 25 of the display 20 are disposed adjacent to and spaced apart from the side wall structures 110 by predetermined distances in a horizontal direction.

The display 20 includes a display control unit 27 (see FIG. 1). The display control unit 27 may be disposed on an upper side of the display 20. The display control unit 27 controls at least one function of the display 20. The display control unit 27 may be connected to a control unit (not shown) that controls the display 20.

Figure 5:
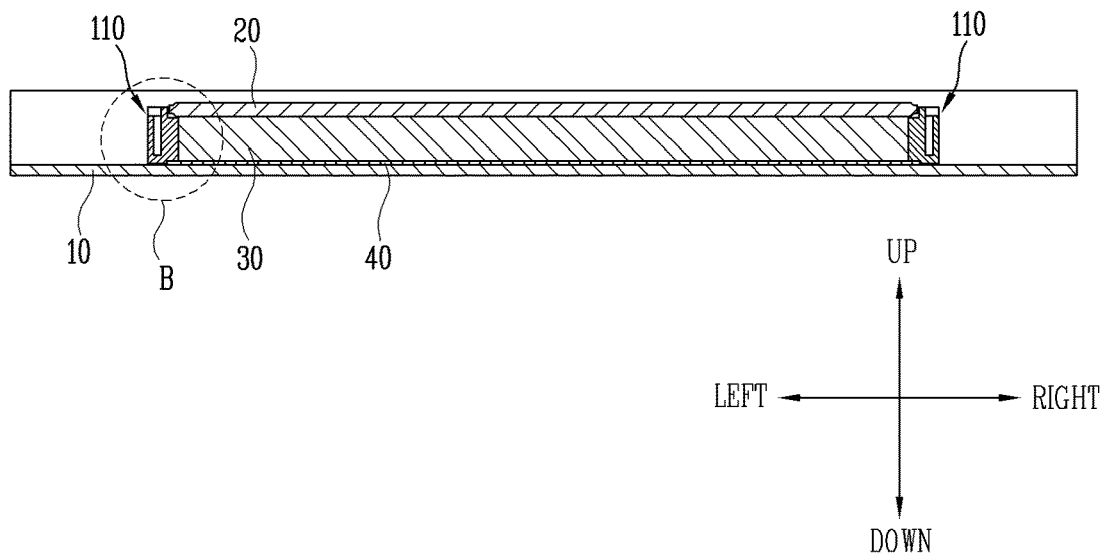
FIG. 5 is a cross-sectional view of the display assembly taken along line A-A' of FIG. 1.
Figure 6:
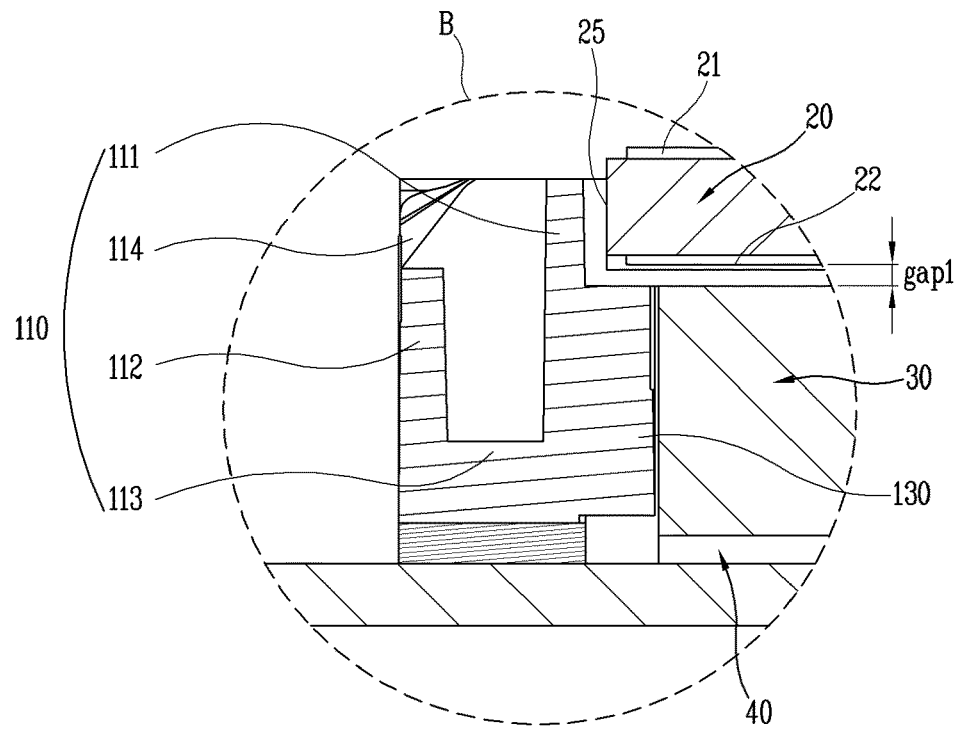
FIG. 6 is a partially enlarged view of region B of the display assembly of FIG. 5.
Figure 7:
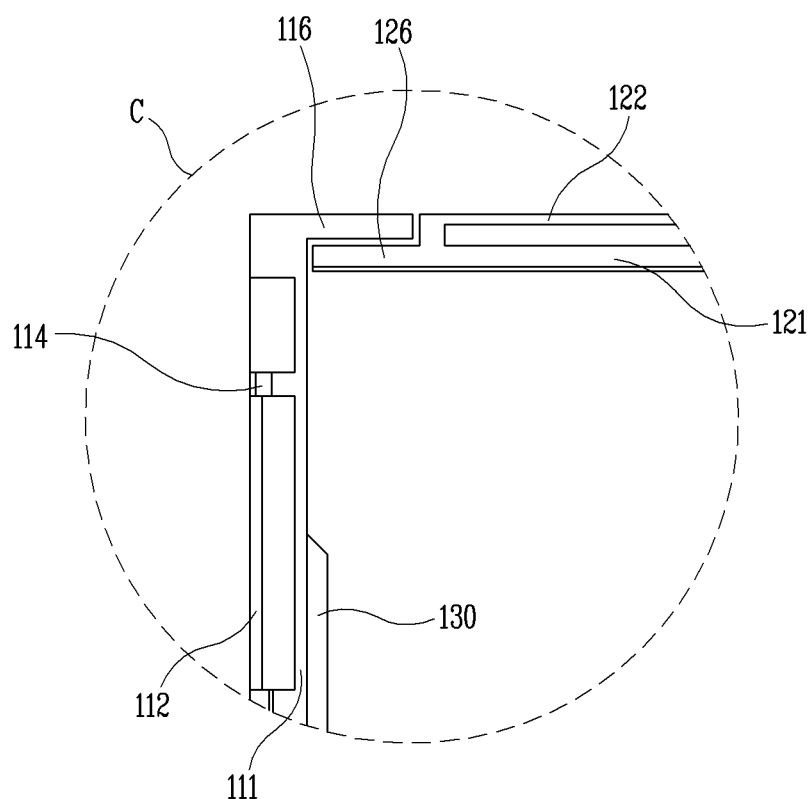
FIG. 7 is a partially enlarged view of region C of FIG. 1, with a display 20 and adhesive layer 30 removed from the display assembly.
Figure 8:
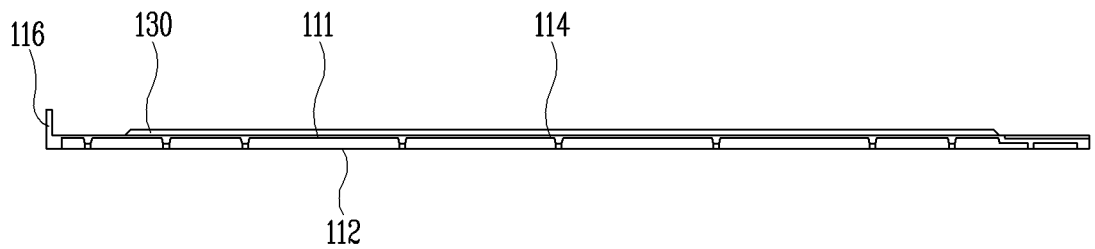
FIG. 8 is a top planar view of a portion of the side wall structure 110 of FIG. 6.
Figure 9:
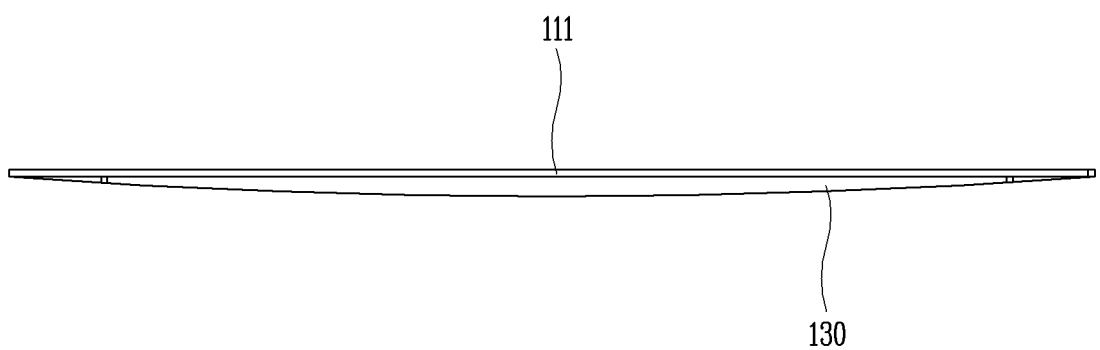
FIG. 9 is a lateral view of the portion of the side wall structure 110 of FIG. 6 taken from a side of the side wall structure 110.
Figure 10:
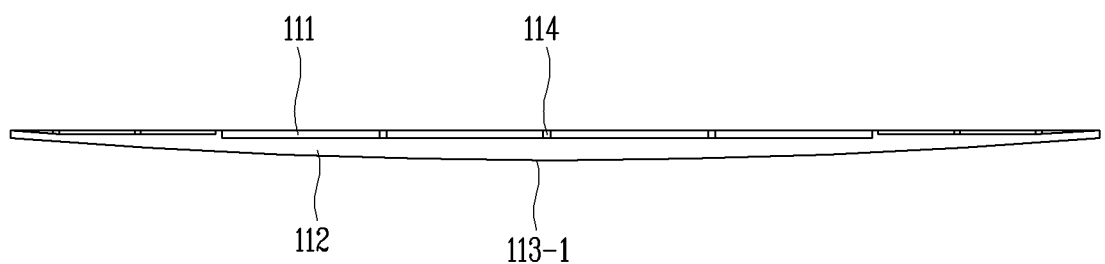
FIG. 10 is a lateral view of the portion of the side wall structure 110 of FIG. 6 taken from a side of the side wall structure 110 opposite to the side from which the view in FIG. 9 is depicted.
Figure 11:
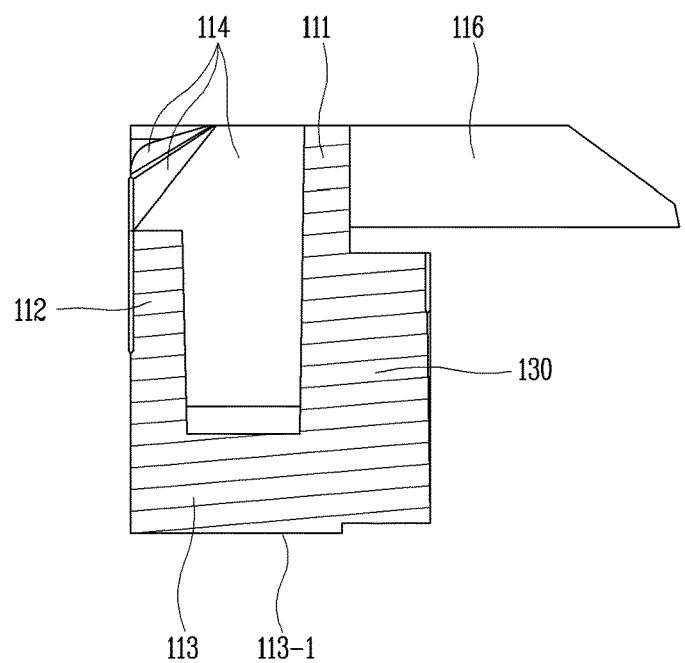
FIG. 11 is a cross-sectional view of the portion of the side wall structure 110 taken along line D-D' of FIG. 8.
Figure 12:
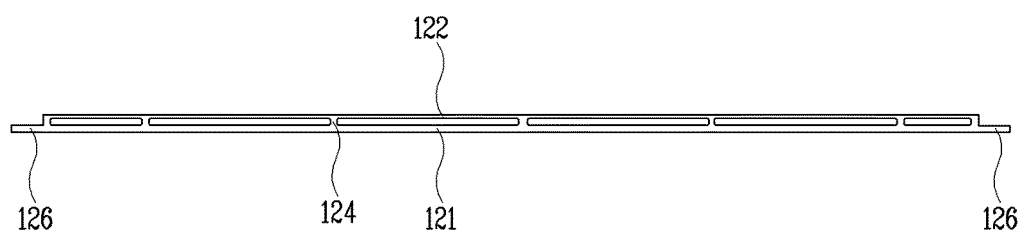
FIG. 12 is a planar view of a front wall structure 120 of FIG. 6, viewed from a top side of the front wall structure 120.
Figure 13:
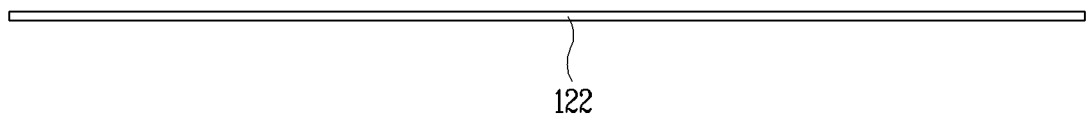
FIG. 13 is a rear view of the front wall structure 120 of FIG. 12, viewed from a rear side of the front wall structure 120.
Figure 14:
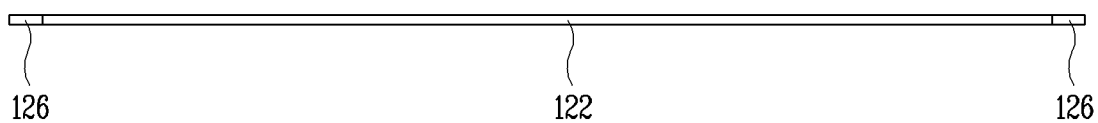
FIG. 14 is a front view of the front wall structure 120 of FIG. 12, viewed from a front side of the front wall structure 120.
Figure 15:
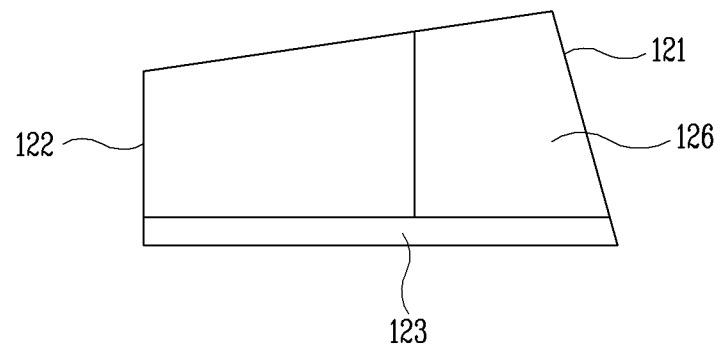
FIG. 15 is a lateral view of the front wall structure 120 of FIG. 12, viewed from a lateral side of the front wall structure 120.

As shown in FIGS. 5 and 6, The adhesive layer 30 may be disposed between the display 20 and the cover 10. The adhesive layer 30 may be made of an optical adhesive material. The adhesive layer 30 may be transparent so as to allow light emitted from the display 20 to pass through. Various suitable adhesive materials may be used as the optical adhesive material such as an Optical Clear Resin (OCR) and Optical Clear Adhesive (OCA). Although implementations described herein utilize OCR as an optical adhesive material, other suitable adhesive materials may also be utilized.

The adhesive layer 30 may be formed by curing a liquid adhesive material. The adhesive layer 30 obtains a shape based on the manner in which a liquid adhesive material is cured in contact with the cover 10, the wall structure 100, or the display 20. The adhesive layer 30 may be transparent to allow light emitted from the display 20 to pass through. The adhesive layer 30 prevents external light coming through the cover 10 from being reflected on a contact surface between the adhesive layer 30 and the adhesion surface of the display, thereby improving visibility of the display 20.

OCR may be applied in a liquid phase, and may flow along the shapes of the cover 10, the wall structure 100 and the display 20. OCR may be applied in a liquid phase and then naturally cured, may be cured by catalysis of ultraviolet rays irradiated, or may be thermally cured, depending on types.

In a general manufacturing process, OCR may be coated on the cover 10 more than a proper amount to prevent a case where the display 20 is not fully bonded due to the lack of OCR. Accordingly, there is a need for a method of preventing the OCR from flowing over edges of a surface, to which the display 20 is attached on the cover 10, and affecting other members of the display assembly.

To prevent OCR overflow, a method of applying and curing a dam by using a liquid resin or the like has been used. However, problematically, the shape of the dam is generally not uniform on a curved surface.

Implementations of the wall structure 100 described herein, are advantageous in that an accommodation space of the OCR can be constantly maintained even on a curved surface owing to a uniform shape of the wall structure 100.

The adhesive layer 30 allows the display 20 to adhere onto the cover 10. The adhesive layer 30 reduces an amount of light, which is reflected before reaching the display 20 after coming into the cover 10 through the light-transmissive portion of the cover 10. The adhesive layer 30 may be configured to have a refractive index equivalent to that of the light-transmissive portion of the cover 10. The adhesive layer 30 may be configured to have a refractive index equivalent to that of the display 20. The adhesive layer 30 may lower reflectance at an interface with the cover 10 and at a contact surface with the display 20. In this manner, the adhesive layer 30 may improve visibility of the display 20.

In some cases, the adhesive layer 30 formed as the OCR may be cured in a contact state with the display 20, the cover 10, and the wall structure 100. The OCR may be applied in a liquid phase and then naturally cured, may be cured by catalysis of ultraviolet rays irradiated, or may be thermally cured, depending on types. In some cases, the OCR may be applied in a liquid phase and cured in a state flown along a shape of a surface brought into contact with the cover 10, the wall structure 100, and the display 20, to form the adhesive layer 30, thereby providing adhesion force (or bonding force).

The adhesive layer 30 provides adhesion force to the display 20, the cover 10 and the wall structure 100. The adhesive layer 30 allows the display 20 to be placed in non-contact with other members such as the cover 10 and the wall structure 100. The adhesive layer 30 as a liquid adhesive material is cured in a contact state with the cover 10, the display 20, and/or the wall structure 100.

The above-described display assembly has an advantage in that the display 20 is prevented from being stressed or deformed due to manufacturing tolerances. In addition, the display 20 in the display assembly has an improved durability against external impacts. Heat generated in the display 20 and transmitted to the cover 10 may also be reduced.

In some implementations, the adhesive layer 30 may be disposed between the display 20 and the upper surface 12 of the cover 10. The adhesive layer 30 may have an upper surface brought into contact with the display bottom surface 22. The adhesive layer 30 may have a lower surface brought into contact with the cover bottom surface 12 and a touch sensing portion 40 when the touch sensing portion 40 is disposed.

As shown in FIGS. 5 and 6, the adhesive layer 30 has a side surface brought into contact with a protrusion 130 of the wall structure 100. The protrusion 130 of the wall structure 100 can increase a contact area between the wall structure 100 and the adhesive layer 30, thereby enhancing durability of the adhesive layer 30 against external impact.

The adhesive layer 30 may also be brought into contact with an adhered portion between the wall structure 100 and the cover 10. Therefore, a material that does not cause inhibition of OCR curing is preferably used as the adhesive material for bonding the wall structure 100 and the cover 10 to each other.

The adhesive layer 30 is brought into close contact with the cover 10 and the touch sensing portion 40 and bonded thereto when the touch sensing portion 40 is disposed, thereby improving adhesive force of the cover 10 and the touch sensing portion 40.

The display assembly may further include a touch sensing portion 40. The touch sensing portion 40 may be formed such that a contact surface with the cover 10 is curved or flat to correspond to the shape of the upper surface 12 of the cover 10. The touch sensing portion 40 senses the touch of a person. The touch sensing portion 40 can be of a contact sensing type, such as an electrostatic type or a piezoelectric type. In some cases, the touch sensing portion 40 may be formed in the shape of a rectangular plate having a constant thickness. The touch sensing portion 40 may be transparent. The touch sensing portion 40 may be disposed between the upper surface 12 of the cover 10 and the adhesive layer 30 and is attached thereto.

The wall structure 100 may be formed in a bar-like shape extending along the side surface of the display 20. The wall structure 100 may extend along the upper surface 12 of the cover 10, and may be formed of a transparent or opaque material.

Hereinafter, a direction toward a center of the cover 10 is defined as "inner side" and a direction toward an edge of the cover 10 is defined as "outer side" with respect to the wall structure 100 as a reference.

Referring to FIGS. 6-15, the wall structure 100 includes wall structure inner walls 111 and 121, wall structure outer walls 112 and 122, wall structure connecting walls 113 and 123 and wall structure connecting ribs 114 and 124. The wall structure 100 has a cross-section in a cup shape when a width direction is cut vertically. The wall structure 100 includes wall structure outer walls 112 and 122 disposed between a cover edge and the wall structure inner walls 111 and 121. The wall structure 100 is formed as the wall structure inner walls 111 and 121 and the wall structure outer walls 112 and 122 are spaced by a predetermined distance. The wall structure 100 includes an inner space defined by the wall structure inner walls 111 and 121, wall structure outer walls 112 and 122, and the wall structure connecting walls 113 and 123.

The wall structure 100 may be configured by a plurality of parts. The wall structure 100 may have all or part of a plurality of parts integrally formed with the cover 10. For example, in some cases, the wall structure 100 is configured by three parts including a pair of side wall structures 110 and a front wall structure 120. The cover 10 has a cover rear wall formed on a lower side thereof. The cover rear wall has a wall surface which is in contact with the adhesive layer 30. The pair of side wall structures 110 and the cover rear wall are connected to form a space in which the adhesive layer 30 is accommodated.

The pair of side wall structures 110 and the front wall structure 120 are disposed on the cover 10. The pair of side wall structures 110 and the front wall structure 120 are attached to the upper surface 12 of the cover 10. The adhesive layer 30 may also be brought into contact with an adhered portion between the wall structure 100 and the cover 10. Therefore, a material that does not cause inhibition of OCR curing is preferably used as the adhesive material for bonding the wall structure 100 and the cover 10 to each other.

Referring to FIGS. 1, 7, 8, and 11, the pair of side wall structures 110 are provided with a side wall structure coupling protrusion 116 protruding from an upper end thereof toward the front wall structure 120. The side wall structure coupling protrusion 116 forms a 90-degree angle with the side wall structure 110. The front wall structure 120 is provided with front wall structure coupling protrusions 126 formed on both ends thereof to correspond to the side wall structure coupling protrusions 116 of the side walls 110. In the plurality of wall structures 100 constructed as described above, such coupling portions are formed in a staggered (or zig-zag) coupling structure.

The wall structure 100 may be provided with a wall structure protrusion 130 formed on an inner surface of the side wall structure 110. The wall structure protrusion 130 is disposed such that an upper end thereof forms an upper gap g1 from the display bottom surface 22 (see FIG. 6). The wall structure protrusion 130 will be described in detail below.

In some implementations, the wall structure 100 may include a defoaming passage. The defoaming passage employs a staggered structure, so that air is discharged through the defoaming passage and the OCR does not flow into the defoaming passage during adhesion of the display 20. The defoaming passage penetrates through one surface of the wall structure 100 in contact with the adhesive layer and another surface of the wall structure that is on a face of the wall structure 100 opposite to the one surface of the wall structure 100. The defoaming passage penetrates through the wall structure inner walls 111 and 121 and the wall structure outer walls 112 and 122. The defoaming passage penetrates through an inner surface of the wall structure inner wall 111, 121 and an outer surface of the wall structure outer wall 112, 122. The wall structure 100 is formed such that the defoaming flow path 40 has a shape bent at least once. The wall structure 100 may have the defoaming passage which is partially connected and partially separated when viewed in an up-down direction.

In some implementations, the defoaming passage may be formed in coupling portions of the plurality of wall structures 100. For example, the defoaming passage may be formed at the coupling portion between the side wall structure 110 and the front wall structure 120.

The coupling portion of the plurality of wall structures 100 is formed in the staggered coupling structure as described above, and is adhered on the cover 10 while maintaining a predetermined gap, thereby forming the defoaming passage. In this manner, the wall structure 100 can prevent the OCR from leaking to the outside of the wall structure 100 while discharging air to the outside of the wall structure 100 through the defoaming passage when the display 20 is attached. The gap of the defoaming passage may be set in consideration of tolerance of an assembly zig and/or the viscosity of OCR.

In some implementations, the coupling portion of the plurality of wall structures 100 may form the defoaming passage in a manner that the plurality of wall structures 100 are partially connected and partially separated. In such implementations, the OCR is not leaked to outside of the wall structure 100 while discharging air to outside of the wall structure 100 through the defoaming passage during attachment of the display 20, which may result in effective bonding of the display 20.

The display assembly according to the implementations described herein has an advantage in that air is effectively discharged through the defoaming passage during attachment of the display 20, by forming the defoaming passage in a corner portion where the coupling portion of the plurality of wall structures 100 is disposed.

The wall structure 100 is in contact with the side surface of the adhesive layer 30, and thus the side surface of the adhesive layer 130 is uniformly formed. The wall structure 100 prevents an introduction of OCR into other members of the display assembly, thereby lowering a defect rate of the display assembly.

The wall structure 100 accommodates the OCR, which flows over the wall structure inner walls 111 and 121, in the inner space of the wall structure 100 during the attachment of the display 20 so as to prevent the OCR from flowing into other members, and eliminates a process of washing out the OCR flowing over the adhered portion of the display 20. Accordingly, the method of manufacturing the display assembly is simplified. In addition, by preventing the OCR from flowing over edges of a surface, to which the display 20 is attached on the cover 10 and affecting other members, a method of forming a dam by applying and curing a liquid resin has been used. Such an implementation provides an advantage over other display assemblies in which the shape of the dam is not constant on a curved surface depending on the shape of the curved surface, and consequently adhesive resin is not applied uniformly to the inside of the dam. The lack of a uniform application of the adhesive resin can result in unstable quality of the display assembly. In contrast, according to the implementations disclosed herein, the wall structure 100 has a uniform shape and has the OCR evenly applied therein, thereby improving the quality of the display assembly.

Another advantageous feature of the implementations disclosed herein is that the wall structure 100 is provided with the wall structure protrusion 130 to increase the contact area with the adhesive layer 30. This results in an improvement of the durability of the adhesive layer 30 against external impact.

The wall structure 100 is disposed such that a predetermined gap is formed between the wall structure inner walls 111 and 121 and the side surfaces of the display 20 in a horizontal direction. The gap may prevent the generation of foam in a liquid adhesive member by an air-vent function while discharging air between the display 20 and the cover 10 to the outside when attaching the display 20. The wall structure inner walls 111 and 121 will be described in detail below.

The wall structure 100 is disposed on a path through which external light entering the inside of the cover 10 through the light-transmissive portion of the cover 10 moves to other members except for the display assembly, so as to reduce or block influence of the external light. By virtue of such an implementation, the display 20 has improved appearance because the wall structure 100 covers other members when the user views the display 20 at an oblique angle.

The wall structure 100 is disposed on the cover 10. The wall structure 100 is attached on the upper surface 12 of the cover 10. An inner surface of the wall structure 100 is in contact with the side surface of the adhesive layer 30. A lower surface of the wall structure 100 is brought into contact with the upper surface 12 of the cover 10. The wall structure 100 extends long while its inner surface is in contact with the side surface of the adhesive layer 30 and its lower surface is in contact with the upper surface 12 of the cover 10. The wall structure 100 extends along the side surface of the adhesive layer 30. The wall structure 100 is disposed side by side with the surfaces 23, 24 and 25 of the display 20.

The wall structure 100 may be attached to the upper surface 12 of the cover 10 using an adhesive. The adhesive layer 30 may also be brought into contact with an adhered portion between the wall structure 100 and the cover 10. Therefore, a material that does not cause inhibition of OCR curing is preferably used as the adhesive material for bonding the wall structure 100 and the cover 10 to each other.

The wall structure 100 may be disposed such that its upper end is lower than the display top surface 21 and higher than the display bottom surface 22. The wall structure 100 has an upper end disposed between the top and bottom surfaces of the display 20.

The wall structure 100 may be disposed so that the upper end thereof is perpendicularly closer to the display top surface 21 than to the display bottom surface 22. According to such implementations, the display assembly has an advantage that its appearance is improved as the wall structure 100 obscures other members inside the cover 10 when the user views the display 20 at an oblique angle.

The wall structure 100 may be formed to fit into a pre-formed structure of the cover 10.

The pair of side wall structures 110 may be formed in a plane symmetrical shape. The pair of side wall structures 110 are formed in a bar-like shape extending long in a front-rear direction. The pair of side wall structures 110 are formed in a bar-like shape extending along the side surfaces 23, 24 and 25 of the display 20.

The pair of side wall structures 110 may be provided with a side wall structure coupling protrusion 116 protruding from its upper end toward the front wall structure 120. The side wall structure coupling protrusion 116 forms a 90-degree angle with the side wall structure 110. The front wall structure 120 is provided with front wall structure coupling protrusions 126 formed on both ends thereof to correspond to the side wall structure coupling protrusions 116 of the side wall structures 110. According to such implementations, the plurality of wall structures 100 has a coupling portion in a zig-zag (staggered) coupling structure in which the side wall structure coupling protrusion 116 and the wall structure coupling protrusion 126 are engaged with each other in the zig-zag form.

The plurality of wall structures 100 may be provided with a defoaming passage in the coupling portion. The coupling portion between the plurality of wall structures 100 is formed in the zig-zag (staggered) coupling structure as described above, and is adhered on the cover 10 while maintaining a predetermined gap, thereby forming the defoaming passage. As described above, in this manner, the wall structure 100 can prevent the OCR from leaking to the outside of the wall structure 100 while discharging air to the outside of the wall structure 100 through the defoaming passage when the display 20 is attached.

In some implementations, each of the pair of side wall structures 110 may include a side wall structure inner wall 111, a side wall structure outer wall 112, a side wall structure connecting wall 113, and/or a side wall structure connecting rib 114 (see FIGS. 6-11). The side wall structure inner wall 111 may be formed in a bar-like shape extending long along the side surfaces 23, 24 and 25 of the display 20. The side wall structure inner wall 111 may be formed to have a constant thickness. The side wall structure inner wall 111 may be formed such that its lower side is thicker than its upper side to reinforce rigidity.

In some cases, the side wall structure inner wall 111 may be formed such that its upper surface is flat. In some cases, the side wall structure inner wall 111 may have a rounded top corner so that the liquid OCR flows toward the wall structure 100 without flowing toward the display top surface 21 when the liquid OCR overflows during the adhesion of the display 20.

The side wall structure inner wall 111 may be connected to the side wall structure outer wall 112 by the side wall structure connecting wall 113 and the side wall structure connecting rib 114. The lower end of the side wall structure inner wall 111 may be connected to the lower end of the side wall structure outer wall 112 by the side wall structure connecting wall 113. The side wall structure inner wall 111 may form an inner space of the side wall structure together with the side wall structure outer wall 112 and the side wall structure connecting wall 113.

The side wall structure inner wall 111 may be disposed such that its upper end is lower than the display top surface 21 and higher than the display bottom surface 22. The side wall structure 110 may have an upper end disposed between the display top surface 21 and the display bottom surface 22.

The side wall structure 111 may be disposed so that its upper end is perpendicularly closer to the display top surface 21 than to the display bottom surface 22. According to such implementations, the display assembly has an advantage that its appearance is improved as the wall structure 100 obscures other members inside the cover 10 when the user views the display 20 at an oblique angle.

The side wall structure outer wall 112 may be formed in a bar-like shape extending long along the side surfaces 23, 24 and 25 of the display 20 and may have substantially the same shape as the side wall structure inner wall 111. The side wall structure outer wall 112 may be formed to have a predetermined thickness and such that its lower side is thicker than its upper side to reinforce rigidity.

In some cases, an upper surface of the side wall structure outer wall 112 is flat. The side wall structure outer wall 112 may be connected to the side wall structure inner wall 111 by the side wall structure connecting wall 113 and the side wall structure connecting rib 114. The lower end of the side wall structure outer wall 112 may be connected to the lower end of the side wall structure inner wall 111 by the side wall structure connecting wall 113. The side wall structure outer wall 112 may form an inner space of the side wall structure together with the side wall structure inner wall 111 and the side wall structure connecting wall 113.

The side wall structure outer wall 112 may be formed such that its upper end is lower than an upper end of the side wall structure inner wall 111. The side wall structure outer wall 112 may be formed to have a height in inverse proportion to a distance between the side wall structure inner wall 111 and the side wall structure outer wall 112 and may be formed to maintain a volume of the inner space of the side wall structure 110.

In some implementations, a lower surface of the side wall structure connecting wall 113 may contact the upper surface 12 of the cover 10. The side wall structure connecting wall 113 may be curved in correspondence with the curvature of the upper surface 12 of the cover 10 so that the lower surface thereof is in contact with the upper surface 12 of the cover 10. The side wall structure connecting wall 113 is attached to the upper surface 12 of the cover 10 using an adhesive. The adhesive layer 30 may also be brought into contact with an adhered portion between the wall structure 100 and the cover 10. Therefore, a material that does not cause inhibition of OCR curing is can be used as the adhesive material for bonding the side wall structure connecting wall 113 and the cover 10 to each other.

The side wall structure connecting wall 113 may be formed in a bar-like shape extending long in a direction in which the side wall structure inner wall 111 and the side wall structure outer wall 112 extend. The side wall structure connecting wall 113 connects the lower end of the side wall structure inner wall 111 and the lower end of the side wall structure outer wall 112. The side wall structure connecting wall 113 forms an inner space of the side wall structure 110 together with the side wall structure inner wall 111 and the side wall structure outer wall 112.

In some cases, the side wall structure 110 does not include the side wall structure connecting wall 113. In such cases, the upper surface 12 of the cover 10 forms the inner space of the side wall structure 110, instead of the connecting wall, together with the side wall structure inner wall 111 and the side wall structure outer wall 112. The side wall structure inner wall 111 and the side wall structure outer wall 112 may be connected by ribs.

Side wall structure connecting ribs 114 are formed to have a predetermined thickness. The side wall structure connecting ribs 114 may be connected to the side wall structure inner wall 111 and the side wall structure outer wall 112. The side wall structure connecting ribs 114 may be arranged such that a plurality of ribs in a low height portion of the side wall structure 110 are arranged closer to one another than a plurality of ribs in a high height portion, thereby reinforcing rigidity of the side wall structure 110.

The side wall structure connecting ribs 114 may be formed such that an upper surface thereof is flat in order to connect the upper end of the side wall structure inner wall 111 and the upper end of the outer wall 112. The side wall structure connecting ribs 114 may be formed such that the upper surface thereof has the same height as the upper end of the side wall structure inner wall 111. The side wall structure connecting ribs 114 may be formed to have a portion, which has the same height as the upper end of the side wall structure inner wall 11, and to be downwardly inclined.

The side wall structure 110 may include a wall structure protrusion 130 that, in some cases, is formed on the inner surface thereof in contact with the adhesive layer 30. The wall structure protrusion 130 may protrude toward the center of the adhesive layer 30. The wall structure protrusion 130 may extend in a direction in which the side wall structure 110 extends.

In some implementations, the wall structure protrusion 130 may have a rectangular cross section. The wall structure protrusion 130 may be formed such that its upper surface corresponds to the display bottom surface. In such implementations, the display bottom surface 22 of display 20 may have a flat shape, and the wall structure protrusion 130 may have an upper surface in the flat shape.

The wall structure protrusion 130 may have a lower surface which is curved to correspond to a curved lower surface of the side wall structure connecting wall 113. The wall structure protrusion 130 may be formed higher than the lower surface of the side wall structure connecting wall 113 by a predetermined length, but is not limited thereto. The wall structure protrusion 130 may alternatively be formed to be connected to the lower surface of the side wall structure connecting wall 113. The side wall structure 110 may be configured such that the side wall structure connecting wall 113 and the lower surface of the wall structure protrusion 130 are brought into contact with the upper surface 12 of the cover 10.

The wall structure protrusion 130 may have a lower surface which is formed straight to be positioned at a predetermined distance from the upper end of the side wall structure inner wall 111, irrespective of the shape of the lower surface of the side wall structure connecting wall 113.

The wall structure protrusion 130 may be spaced apart from one end, e.g., a front end, a rear end, of the side wall structure 110 by a predetermined distance. The wall structure protrusion 130 may be spaced apart from the coupling portion between the side wall structure 110 and the front wall structure 120 by a predetermined distance. The wall structure protrusion 130 may be spaced apart in a horizontal direction from a corner, at which the upper surface and a left surface of the display 20 meet, by a predetermined distance.

In some cases, the display 20 may be tilted to one side to effectively attach the display 20 to the cover 10. The wall structure protrusion 130 allows the OCR of the liquid phase to smoothly flow in a front-rear direction that the wall structure protrusion 130 extends when the display 20 is attached in a tilted manner to the cover 10. Such an implementation advantageously reduces the liquid OCR flowing over the side wall structure inner wall 111.

The wall structure protrusion 130 allows OCR in the liquid phase to be effectively coated on the upper surface 12 of the cover 10 to which the display 20 is attached, so that the display 20 can be effectively attached to the cover 10.

The wall structure protrusion 130 can be advantageously formed easier than a protrusion formed from an end of the side wall structure 110 in the front-rear direction.

In some implementations, the wall structure protrusion 130 may be formed such that its end is inclined by a predetermined angle toward the center of the protrusion when viewed from above (top view). The wall structure protrusion 130 may have a trapezoidal shape when viewed from above. The wall structure protrusion 130 may have a rounded edge. In such implementations, the thusly-constructed wall structure protrusion 130 can allow OCR in the liquid phase to smoothly flow along the side wall structure 110, so that the display 20 can be effectively adhered to the cover 10.

In some implementations, the wall structure protrusion 130 may be provided with a plurality of protruding portions on one or more of the side wall structures 110. In some cases, the wall structure protrusion 130 may be provided with a plurality of protruding portions spaced apart from each other at a predetermined interval in the front-rear direction when viewed from above. In some cases, the wall structure protrusion 130 may be provided with a plurality of protruding portions spaced apart from each other at a predetermined interval in an up-down direction when viewing the side wall structure 110 from inside.

The wall structure protrusion 130 may increase a contact area between the side wall structure 110 and the adhesive layer 30, thereby improving durability of the adhesive layer 30 against external impact and vibration. The wall structure protrusion 130 may also advantageously reduce the amount of expensive OCR used to form the adhesive layer 30.

The wall structure protrusion 130 may be disposed such that an upper end thereof forms an upper gap gap1 from the bottom surface of the display 20. The upper gap gap1 may be set in consideration of tolerance of an assembly zig or a viscosity of the liquid OCR. The display 20 may have the bottom surface forming the upper gap gap1 with the upper end of the wall structure protrusion 130, and is adhered on the cover 10.

The wall structure protrusion 130 may thus be configured to allow air between the cover 10 and the display 20 to be discharged to the outside and to prevent the liquid OCR from flowing to the outside through the upper gap gap1 when the display 20 is attached, so that the display 20 can be effectively adhered to the cover 10.

In some implementations, the wall structure protrusion 130 may have an inner end located outside rather than in the active region of the display 20. The wall structure protrusion 130 may have an inner end located outside rather than in the light-transmissive portion of the cover 10, so that light emitted from the display 20 can be effectively emitted to the outside through the light-transmissive portion of the cover 10. The wall structure protrusion 130 may cause light emitted from the display 20 to go outside through the light-transmissive portion of the cover 10 without being interfered with the wall structure protrusion 130.

The wall structure protrusion 130 may be disposed such that an inner end thereof is spaced apart horizontally from the active region of the display 20 by a predetermined distance. The wall structure protrusion 130 may be disposed such that the inner end thereof is spaced apart horizontally from the light-transmissive portion of the cover by a predetermined distance. The wall structure protrusion 130 having the above-described structure can allow improved views of the display 20 even when the user views the bottom surface of the cover 10 at an oblique angle. The wall structure protrusion 130 can prevent the user from feeling a sense of difference even when the user views the cover bottom surface at an oblique angle.

Referring to FIG. 6, a part of the display 20 may be disposed on a straight line which connects an inner edge of the upper end of the wall structure protrusion 130 and an inner edge of the upper end of the side wall structure inner wall 111. The side wall structure 110 having such a structure is advantageous in protecting other members disposed on the cover 10 or inside the main body 10 to which the cover 10 is attached from external direct ray of light. The side wall structure 110 is advantageous in preventing members disposed on the cover 10 or inside the display assembly to which the cover 10 is attached from being visible to the user/viewer, thereby improving appearance.

Figure 4:
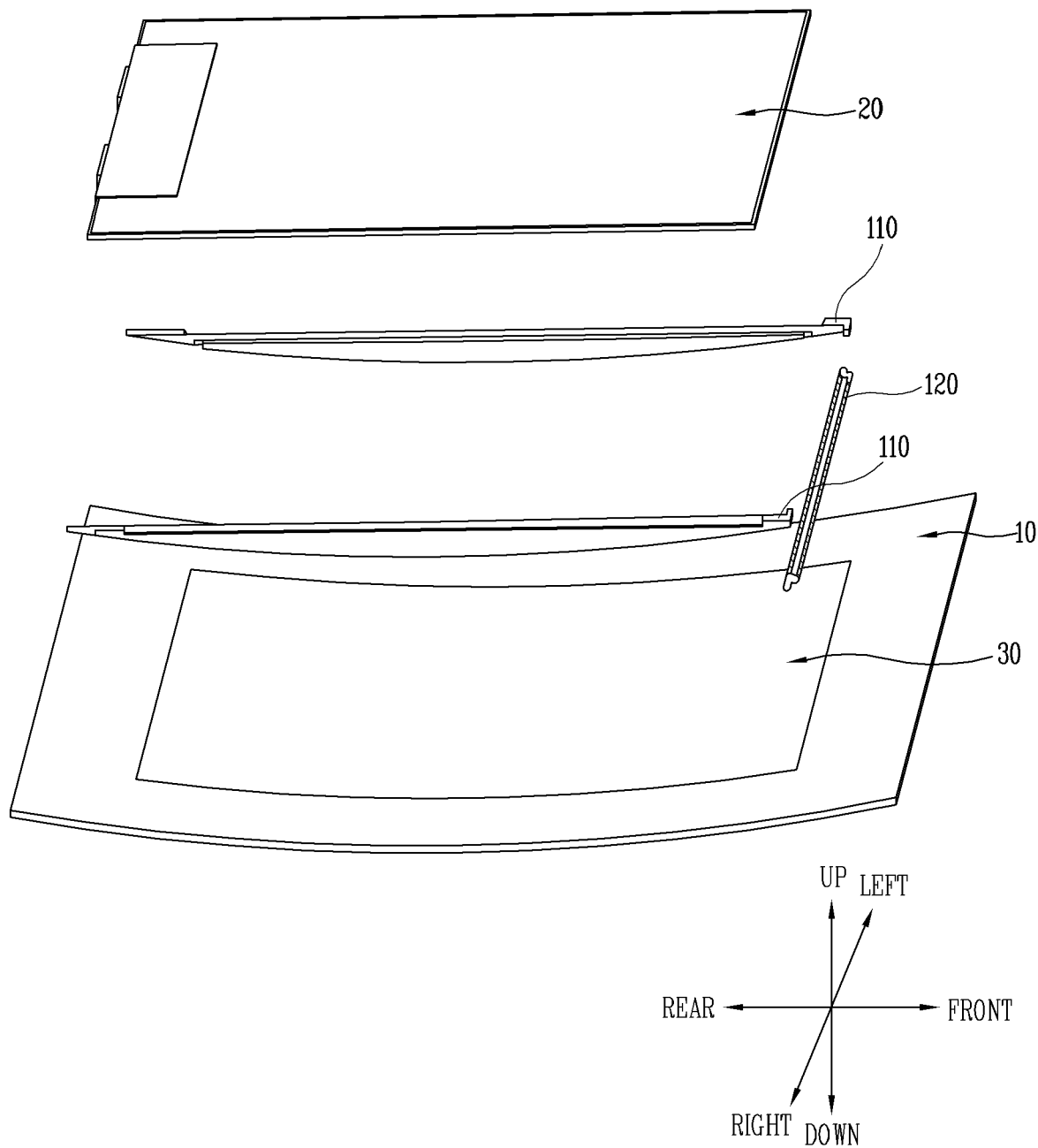
FIG. 4 is an exploded perspective view of the display assembly of FIG. 1.

The wall structure 100 includes a front wall structure 120 (see FIGS. 1 and 4). In some cases, the front wall structure 120 may have a bar-like shape. In some cases, the front wall structure 120 may extend long in a left-right direction. In some cases, the front wall structure 120 may have a bar-like shape extending along the side surfaces of the display 20. In some cases, the front wall structure 120 may be formed such that its lower surface is in contact with the upper surface 12 of the cover 10. In such cases, the upper surface 12 of the cover 10 may be formed such that an adhesion surface to which the display 20 is attached is formed in a shape which is not curved in the left-right direction, and the front wall structure 120 is formed such that the lower surface is flat to correspond to the upper surface 12 of the cover 10.

Referring to FIGS. 7 and 12-16, in some cases, the front wall structure 120 may be provided with front wall structure coupling protrusions 126 protruding from both left and right ends toward the side wall structure 110. In some cases, the front wall structure 120 may be provided with front wall structure coupling protrusions 126 formed to correspond to the side wall structure coupling protrusions 116. The front wall structure coupling protrusions 126 may form a 90-degree angle with the front wall structure 120. In such cases, the plurality of wall structures 100 may have a coupling portion in a zig-zag coupling structure in which the side wall structure coupling protrusion 116 and the wall structure coupling protrusion 126 are engaged with each other in a zig-zag form.

The front wall structure 120 may include a front wall structure inner wall 121, a front wall structure outer wall 122, and/or a front wall structure connecting wall 123. The front wall structure 120 may include front wall structure connecting ribs 124.

The front wall structure 120 may be formed such that its inner surface is inclined outward by a predetermined angle, so that the liquid OCR can smoothly flow when the display 20 is attached.

The front wall structure inner wall 121 is formed in a bar-like shape extending along the side surfaces 23, 24 and 25 of the display 20. The front wall structure inner wall 121 may have a constant thickness. The front wall structure inner wall 121 may be formed such that its lower side is thicker than its upper side to reinforce rigidity.

In some cases, the front wall structure inner wall 121 may be formed such that its upper surface is flat. In some cases, the front wall structure inner wall 121 may have a rounded top edge so that the liquid OCR flows toward the wall structure 100 without flowing toward the display top surface 21 when the liquid OCR overflows during the adhesion of the display 20.

The front wall structure inner wall 121 may be connected to the front wall structure outer wall 122 by the front wall structure connecting wall 123 and the front wall structure connecting rib 124. The lower end of the front wall structure inner wall 121 may be connected to the lower end of the front wall structure outer wall 122 by the front wall structure connecting wall 123. The front wall structure inner wall 121 may form an inner space of the front wall structure together with the front wall structure outer wall 122 and the front wall structure connecting wall 123.

The front wall structure inner wall 121 may be formed such that its inner surface is inclined outward by a predetermined angle, so that the liquid OCR can smoothly flow when the display 20 is attached.

The front wall structure inner wall 121 may be disposed such that its upper end is lower than the display top surface 21 and higher than the display bottom surface 22. The front wall structure 120 may have an upper end disposed between the display top surface 21 and the display bottom surface 22.

The front wall structure inner wall 121 may be disposed so that the upper end thereof is perpendicularly closer to the display top surface 21 than to the display bottom surface 22. In such implementations, the display assembly has an advantage that its appearance is improved as the wall structure 100 obscures other members inside the cover 10 when the user views the display 20 at an oblique angle.

The front wall structure outer wall 122 may be formed in a bar-like shape elongated along the side surfaces of the display 20 and may be formed in the same or similar shape as the front wall structure inner wall 121. The front wall structure outer wall 122 is formed to have a predetermined thickness. The front wall structure outer wall 122 may be formed such that its lower side is thicker than its upper side to reinforce rigidity. The front wall structure outer wall 122 may be formed such that its upper surface is flat.

The front wall structure outer wall 122 may be connected to the front wall structure inner wall 121 by the front wall structure connecting wall 123 and the front wall structure connecting rib 124. The lower end of the front wall structure outer wall 122 may be connected to the lower end of the front wall structure inner wall 121 by the front wall structure connecting wall 123. The front wall structure outer wall 122 may form an inner space of the front wall structure together with the front wall structure inner wall 121 and the front wall structure connecting wall 123.

The front wall structure outer wall 122 may be formed such that its upper end is lower than the front wall structure inner wall 121. The front wall structure outer wall 122 may be formed to have a height in inverse proportion to a distance between the front wall structure inner wall 121 and the front wall structure outer wall 122 and may be formed to maintain a volume of the inner space of the front wall structure 120.

A lower surface of the front wall structure connecting wall 123 may contact with the upper surface 12 of the cover 10. The front wall structure connecting wall 123 may be formed to correspond to the shape of the upper surface 12 of the cover 10 so that the lower surface thereof is in contact with the upper surface 12 of the cover 10. In such implementations, the upper surface 12 of the cover 10 may be formed such that an adhesion surface to which the display 20 is attached is formed in a shape which is not curved in a left-right direction, and the front wall structure connecting wall 123 is formed such that the lower surface is flat to correspond to the upper surface 12 of the cover 10.

The front wall structure connecting wall 123 may be attached to the upper surface 12 of the cover 10 using an adhesive. The adhesive layer 30 may also be brought into contact with an adhered portion between the wall structure 100 and the cover 10. Therefore, a material that does not cause inhibition of OCR curing is preferably used as the adhesive material for bonding the front wall structure connecting wall 123 and the cover 10 to each other.

The front wall structure connecting wall 123 may have a bar-like shape extending long in a direction in which the front wall structure inner wall 121 and the front wall structure outer wall 122 extend. The front wall structure connecting wall 123 may connect the lower end of the front wall structure inner wall 121 and the lower end of the front wall structure outer wall 122.

The front wall structure connecting wall 123 may forms an inner space of the front wall structure 120 together with the front wall structure inner wall 121 and the front wall structure outer wall 122. In some implementations, the front wall structure 120 does not include the front wall structure connecting wall 123. In such implementations, the upper surface 12 of the cover 10 forms the inner space of the front wall structure 120, instead of the connecting wall, together with the front wall structure inner wall 121 and the front wall structure outer wall 122. The front wall structure inner wall 121 and the front wall structure outer wall 112 may be connected by ribs.

The front wall structure connecting ribs 124 may have a predetermined thickness. The front wall structure connecting ribs 124 may connect the front wall structure inner wall 121 and the front wall structure outer wall 122. The front wall structure connecting ribs 124 may be arranged such that a plurality of ribs in a low height portion of the front wall structure 120 are arranged closer to one another than a plurality of ribs in a high height portion, thereby reinforcing rigidity of the front wall structure 120.

The front wall structure connecting ribs 124 may be formed such that an upper surface thereof is formed flat to connect the upper end of the front wall structure inner wall 121 and the upper end of the outer wall 122. The front wall structure connecting ribs 124 may be formed such that the upper surface thereof has the same height as the upper end of the front wall structure inner wall 121. The front wall structure connecting ribs 124 may be formed in a shape of being downwardly bent by a predetermined length so that a height thereof is the same as the upper end of the front wall structure inner wall 121.

While this specification contains many specifics, these should not be construed as limitations on the scope of the disclosure or of what may be claimed, but rather as descriptions of features specific to particular implementations. Certain features that are described in this specification in the context of separate implementations may also be implemented in combination in a single implementation. Conversely, various features that are described in the context of a single implementation may also be implemented in multiple implementations separately or in any suitable sub-combination. Moreover, although features may be described above as acting in certain combinations and may even be claimed as such, one or more features from a claimed combination may in some cases be excised from the combination, and the claimed combination may be directed to a sub-combination or variation of a sub-combination.

It should be understood that the separation of various system components in the implementations described above should not be understood as requiring such separation in all implementations. The described program components and systems may generally be integrated together in a single software product or packaged into multiple software products.

It should be understood that the phrase one or more of and the phrase at least one of include any combination of elements. For example, the phrase one or more of A and B includes A, B, or both A and B. Similarly, the phrase at least one of A and B includes A, B, or both A and B.

The scope of the present disclosure should be decided by rational interpretation of the appended claims and all changes and modifications that fall within the metes and bounds of the claims, or equivalents of such metes and bounds are therefore intended to be embraced by the appended claims.

What is claimed is:

1. A display assembly comprising:
a cover comprising a curved surface;
a display disposed on the curved surface;
an adhesive layer disposed between the cover and the display; and
a wall structure disposed on the cover and extending along a side surface of the adhesive layer, the wall structure comprising:
an inner wall comprising one surface in contact with the side surface of the adhesive layer, an upper end of the inner wall being lower than a top surface of the display and higher than a bottom surface of the display, the upper end of the inner wall being perpendicularly closer to the top surface of the display than to the bottom surface of the display; and
an outer wall disposed between the inner wall and an edge of the cover; and
a connecting wall connected to the inner wall and the outer wall,
wherein an inner space defined by the inner wall, outer wall, and the connecting wall is configured to accommodate an overflow of liquid adhesive material over the inner wall and to prevent the liquid adhesive material from overflow onto other members of the display assembly,
wherein a first surface of the wall structure is in contact with the curved surface and a second surface of the wall structure is in contact with the side surface of the adhesive layer, and
wherein the wall structure comprises a protrusion protruding from a surface of the wall structure and extending in a direction in which the wall structure extends, the surface of the wall structure being in contact with the adhesive layer and the protrusion protruding toward a center of the adhesive layer.

2. The display assembly of claim 1, wherein:
the curved surface is bent in a first direction; and
the wall structure comprises a pair of side wall structures facing each other.

3. The display assembly of claim 1, wherein the wall structure has an upper end disposed between a top surface and a bottom surface of the display.

4. The display assembly of claim 1, wherein the protrusion is spaced apart from an outer end of the wall structure.

5. The display assembly of claim 1, further configuring:
a defoaming passage penetrating through the second surface of the wall structure, which is in contact with the adhesive layer, and a third surface of the wall structure that is on a face of the wall structure opposite to the second surface of the wall structure, wherein the defoaming passage has a shape bent at least once.

6. The display assembly of claim 1, wherein the cover has at least one surface formed to be curved or flat, and
wherein a plurality of displays is arranged on the at least one surface.

7. A vehicle comprising the display assembly of claim 1.

8. The display assembly of claim 1, wherein the inner wall comprises a rounded top corner to guide adhesive flow toward the wall structure when an overflow occurs during adhesion.

9. The display assembly of claim 1, wherein an upper end of the outer wall is connected to a side surface of the inner wall through a connecting rib.

10. The display assembly of claim 1, wherein a height of the outer wall is inversely proportional to a distance between the inner wall and outer wall.

11. A display assembly comprising:
a cover having a curved surface;
a display disposed on the curved surface;
an adhesive layer configured to attach the display onto the cover, the adhesive layer being formed by curing a liquid adhesive material; and
a wall structure disposed on the cover between a surface on which the display is disposed and an edge of the cover to form a space in which the liquid adhesive material is accommodated, the wall structure comprising:
an inner wall comprising one surface in contact with a side surface of the adhesive layer, an upper end of the inner wall being lower than a top surface of the display and higher than a bottom surface of the display, the upper end of the inner wall being perpendicularly closer to the top surface of the display than to the bottom surface of the display;

an outer wall disposed between the inner wall and an edge of the cover; and a connecting wall connected to the inner wall and the outer wall, wherein an inner space defined by the inner wall, outer wall, and the connecting wall is configured to accommodate an overflow of liquid adhesive material over the inner wall and to prevent the liquid adhesive material from overflow onto other members of the display assembly, and wherein the wall structure comprises a protrusion protruding from a surface of the wall structure and extending in a direction in which the wall structure extends, the surface of the wall structure being in contact with the adhesive layer and the protrusion protruding toward a center of the adhesive layer.

12. The display assembly of claim 11, wherein the wall structure is spaced apart from a side surface of the display to provision discharge of air between the display and the cover during an attaching process of the display.

13. The display assembly of claim 11, wherein the protrusion has an upper end spaced apart from a lower surface of the display to provision discharge of air between the display and the cover during an attaching process of the display.

14. A vehicle comprising the display assembly of claim 11.

15. The display assembly of claim 11, wherein the inner wall comprises a rounded top corner to guide adhesive flow toward the wall structure when an overflow occurs during adhesion.

16. The display assembly of claim 11, wherein an upper end of the outer wall is connected to a side surface of the inner wall through a connecting rib.

17. The display assembly of claim 11, wherein a height of the outer wall is inversely proportional to a distance between the inner wall and outer wall.

* * * * *